US012717983B2

(12) United States Patent
Bo

(10) Patent No.: US 12,717,983 B2
(45) Date of Patent: Aug. 25, 2026

(54) METHOD FOR GENERATING A REDUCED EQUIVALENT MODEL OF AN ELECTRIC POWER NETWORK FOR SCED AND SCUC APPLICATIONS

(71) Applicant: The Curators of the University of Missouri, Columbia, MO (US)

(72) Inventor: Rui Bo, Rolla, MO (US)

(73) Assignee: The Curators of the University of Missouri, Columbia, MO (US)

( * ) Notice: Subject to any disclaimer, the term of this patent is extended or adjusted under 35 U.S.C. 154(b) by 1083 days.

(21) Appl. No.: 17/860,423

(22) Filed: Jul. 8, 2022

(65) Prior Publication Data

US 2023/0011140 A1 Jan. 12, 2023

Related U.S. Application Data

(60) Provisional application No. 63/220,160, filed on Jul. 9, 2021.

(51) Int. Cl.
*G06F 30/18* (2020.01)

(52) U.S. Cl.
CPC .................................... *G06F 30/18* (2020.01)

(58) Field of Classification Search
CPC .......... G06F 30/20; G06F 30/25; G06F 30/27; G06F 30/28; G06F 2111/00; G06F 2119/22; B60W 60/0015; B60W 30/09; B60W 30/0956
See application file for complete search history.

(56) References Cited

U.S. PATENT DOCUMENTS

| | | | | |
|---|---|---|---|---|
| 10,325,047 | B2 * | 6/2019 | Chang | G06F 30/367 |
| 2013/0091258 | A1 * | 4/2013 | Shaffer | H02J 3/00 709/224 |
| 2016/0097795 | A1 * | 4/2016 | Chang | G06F 30/367 702/60 |

OTHER PUBLICATIONS

Y. Zhang, M. Larsson, J. Turunen, H. Liisa, “Network Reduction for Power Flow Based Applications”, 6 pages, 2013 (Year: 2013).*
D. Shi, D. J. Tylavsky, “A Novel Bus-Aggregation-Based Structure Preserving Power System Equivalent”, pp. 1977-1986, 2015 (Year: 2015).*

(Continued)

*Primary Examiner* — Kibrom K Gebresilassie
(74) *Attorney, Agent, or Firm* — HOVEY WILLIAMS LLP

(57) ABSTRACT

A method for generating a model of an electric power network comprises receiving a description of an electric power network, the electric power network including a plurality of interconnected nodes; selecting a plurality of electric power network branches of focus from the description of the electric power network; generating a plurality of electric power network operating conditions of interest; updating the electric power network branches of focus to include data regarding critical operating conditions of interest; clustering nodes of the electric power network to form a plurality of super nodes; generating a reduced electric power network topology that includes the super nodes; generating a plurality of reduced electric power network electrical parameters; and outputting an electric power network model that includes the reduced electric power network topology and the reduced electric power network electrical parameters.

21 Claims, 4 Drawing Sheets

(56) References Cited

OTHER PUBLICATIONS

E. H. Allen, J. H. Lang, M. D. Ilic, "A Combined Equivalenced-electric, Economic, and Market Representation of the Northeastern Power Coordinating Council U.S. Electric Power System", pp. 896-907, 2018 (Year: 2018).*
Van Der Sluis, Lou, Transients in Power Systems, John Wiley & Sons, Ltd, 2001, 221 pages.
Papaemmanouil et al., "On the reduction of large power system models for power market simulations," In 17th Power Systems Computation Conference (PSCC), 1308-1313, 2011, 7 pages.
Ward, J. B., "Equivalent Circuits for Power-Flow Studies," Electrical Engineering, vol. 68, No. 9 (1949): 794-794, 10 pages.
Snyder, W. L. Jr., "Load Flow Equivalent Circuits—An Overview," Paper given at IEEE Winter Power Meeting, New York, Jan. 30-Feb. 4, 1972, IEEE Preprints, vol. 1, Issue 162-1, 1972, C 72 162-1, 8 pages.
Tinney et al., "Adaptive Reductions for Power Flow Equivalents," IEEE Transactions on Power Systems, vol. PWRS-2, No. 2, May 1987, 351-359, 9 pages.
Allen et al., "A Combined Equivalenced-Electric, Economic, and Market Representation of the Northeastern Power Coordinating Council U.S. Electric Power System," IEEE Transactions on Power Systems, vol. 23, No. 3, Aug. 2008, 896-907, 12 pages.
Zhu et al., "An Optimization-Based DC-Network Reduction Method," IEEE Transactions on Power Systems, vol. 33, No. 3, May 2018, 2509-2517, 9 pages.
Zhu et al., "An optimization based network reduction method with generator placement," In 2015 North American Power Symposium (NAPS), pp. 1-6, IEEE, 2015, 6 pages.
Dimo, Paul, Nodal analysis of power systems, Editura Academiel, Romania, and Abacus Press, England, 1975, pp. 23-24, p. 41, 8 pages.
Zhang et al., "Network Reduction for Power Flow Based Applications," In 2013 IEEE Grenoble Conference, pp. 1-6, EEE, 2013, 6 pages.
Ashraf et al., "Performance Analysis of Static Network Reduction Methods Commonly Used in Power Systems," In 2014 Eighteenth National Power Systems Conference (NPSC), pp. 1-6, IEEE, 2014, 6 pages.
Gupta et al., "Power System Network Equivalents: Key Issues and Challenges," TENCON 2018—2018 IEEE Region 10 Conference, Jeju, Korea, Oct. 28-31, 2018, pp. 2291-2296, IEEE, 2018, 6 pages.
Oh, HyungSeon, "A New Network Reduction Methodology for Power System Planning Studies," IEEE Transactions on Power Systems, vol. 25, No. 2, May 2010, 677-684, 8 pages.
Cheng et al., "PTDF-Based Power System Equivalents," IEEE Transactions on Power Systems, vol. 20, No. 4, Nov. 2005, 1868-1876, 9 pages.
Oh, HyungSeon, "Aggregation of Buses for a Network Reduction," IEEE Transactions on Power Systems, vol. 27, No. 2, May 2012, 705-712, 8 pages.
Shi et al., "An Improved Bus Aggregation Technique for Generating Network Equivalents," In 2012 IEEE Power and Energy Society General Meeting, pp. 1-8, IEEE, 2012, 9 pages.
Marinho et al., "Network Reduction Based on Multiple Scenarios," In 2017 IEEE Manchester PowerTech, pp. 1-6, EEE, 2017, 6 pages.
Shi et al., "A Novel Bus-Aggregation-Based Structure-Preserving Power System Equivalent," IEEE Transactions on Power Systems, vol. 30, No. 4, Jul. 2015, 1977-1986, 10 pages.
Gebrekiros et al., "Assessment of PTDF Based Power System Aggregation Schemes," In 2015 IEEE Electrical Power and Energy Conference (EPEC), 358-363, IEEE, 2015, 6 pages.
Shayesteh et al., "ATC-Based System Reduction for Planning Power Systems With Correlated Wind and Loads," IEEE Transactions on Power Systems, vol. 30, No. 1, Jan. 2015, 429-438, 10 pages.
Jang et al., "Line Limit Preserving Power System Equivalent," In 2013 IEEE Power and Energy Conference at Illinois (PECD), 206-212, IEEE, 2013, 7 pages.
Fortenbacher et al., "Transmission Network Reduction Method using Nonlinear Optimization," In 2018 Power Systems Computation Conference (PSCC), pp. 1-7, IEEE, 2018, 7 pages.
Shi, Di, "Power System Network Reduction for Engineering and Economic Analysis", PhD Dissertation, Arizona State University, Dec. 2012, 175 pages.

* cited by examiner

FULL SCALE ELECTRIC POWER NETWORK TOPOLOGY

EQUIVALENT REDUCED ELECTRIC POWER NETWORK TOPOLOGY

METHOD FOR GENERATING A REDUCED EQUIVALENT MODEL OF AN ELECTRIC POWER NETWORK FOR SCED AND SCUC APPLICATIONS

STATEMENT REGARDING FEDERALLY SPONSORED RESEARCH OR DEVELOPMENT

This invention was made with government support under Contract No. D18AP00054 awarded by the Defense Advanced Research Projects Agency (DARPA). The government has certain rights in the invention.

RELATED APPLICATIONS

The current patent application is a non-provisional patent application which claims priority benefit, with regard to all common subject matter, to a provisional application with U.S. Provisional Application Ser. No. 63/220,160, entitled "METHOD FOR GENERATING A REDUCED EQUIVALENT MODEL OF AN ELECTRIC POWER NETWORK FOR SCED AND SCUC APPLICATIONS", and filed Jul. 9, 2021. The earlier-filed provisional application is hereby incorporated by reference in its entirety into the current application.

FIELD OF THE INVENTION

Embodiments of the current invention relate to methods for generating models of electric power networks.

BACKGROUND

Power system operators, utility commissions, and others with an interest in electric power generation, transmission, and distribution often want to analyze an electric power generation, transmission, and distribution network or grid for a particular region to determine the ability of the electric power network to supply power to meet a demand. The analysis may determine whether the output of the electric power generators is sufficient, whether areas of the electric power network, including various transmission lines and/or substations, can handle the electric current flow needed to meet a customer load, what a cost of the electric power supply will be, and other factors. The analysis may be carried out to determine the performance of the network over the short term, such as the next few hours or days, or the long term, such as the next few months or years.

The analysis is typically carried out using security constrained economic dispatch (SCED) and security constrained unit commitment (SCUC) computer software programs. These programs are typically executed using full scale, detailed models of the electric power network. One significant drawback of this approach is that executing the SCED and/or SCUC programs on a full scale model of the electric power network for a single scenario often requires a computation time ranging from half an hour for short term applications to days and weeks for long term applications. The problem is further exacerbated because the analysis for dozens or hundreds of scenarios is usually sought in a short period of time.

SUMMARY OF THE INVENTION

Embodiments of the current invention address one or more of the above-mentioned problems and provide a distinct advance in the art of generating models of electric power networks. Specifically, embodiments of the current invention provide methods and computing devices for generating an equivalent model of an electric power network that is much smaller in size and much quicker to simulate in SCED and SCUC programs. One method of the current invention broadly comprises the steps of: receiving a description of an electric power network, the electric power network including a plurality of interconnected nodes; selecting a plurality of electric power network branches of focus from the description of the electric power network; generating a plurality of electric power network operating conditions of interest; updating the electric power network branches of focus to include data regarding critical operating conditions of interest; clustering nodes of the electric power network to form a plurality of super nodes; generating a reduced electric power network topology that includes the super nodes; generating a plurality of reduced electric power network electrical parameters; and outputting an electric power network model that includes the reduced electric power network topology and the reduced electric power network electrical parameters.

One computing device of the current invention broadly comprises a processing element in electronic communication with a memory element. The processing element is programmed, configured, or a combination thereof, to: receive a description of an electric power network, the electric power network including a plurality of interconnected nodes; select a plurality of electric power network branches of focus from the description of the electric power network; generate a plurality of electric power network operating conditions of interest; update the electric power network branches of focus to include data regarding critical operating conditions of interest; cluster a plurality of nodes of the electric power network to form a plurality of super nodes; generate a reduced electric power network topology that includes the super nodes; generate a plurality of reduced electric power network electrical parameters; and output an electric power network model that includes the reduced electric power network topology and the reduced electric power network electrical parameters.

Another embodiment of the current invention provides a method for generating performance data for an electric power network. The method broadly comprises the steps of: receiving a full scale electric power network model including information describing a structure and electrical parameters of the electric power network; generating a reduced electric power network model; executing security constrained economic dispatch or security constrained unit commitment computer software programs using the reduced electric power network model; and outputting performance data including at least plant commitment and dispatch, electric power network electricity flow, and market prices.

This summary is provided to introduce a selection of concepts in a simplified form that are further described below in the detailed description. This summary is not intended to identify key features or essential features of the claimed subject matter, nor is it intended to be used to limit the scope of the claimed subject matter. Other aspects and advantages of the current invention will be apparent from the following detailed description of the embodiments and the accompanying drawing figures.

BRIEF DESCRIPTION OF THE DRAWING FIGURES

Embodiments of the current invention are described in detail below with reference to the attached drawing figures, wherein.

Figures 1, 2:
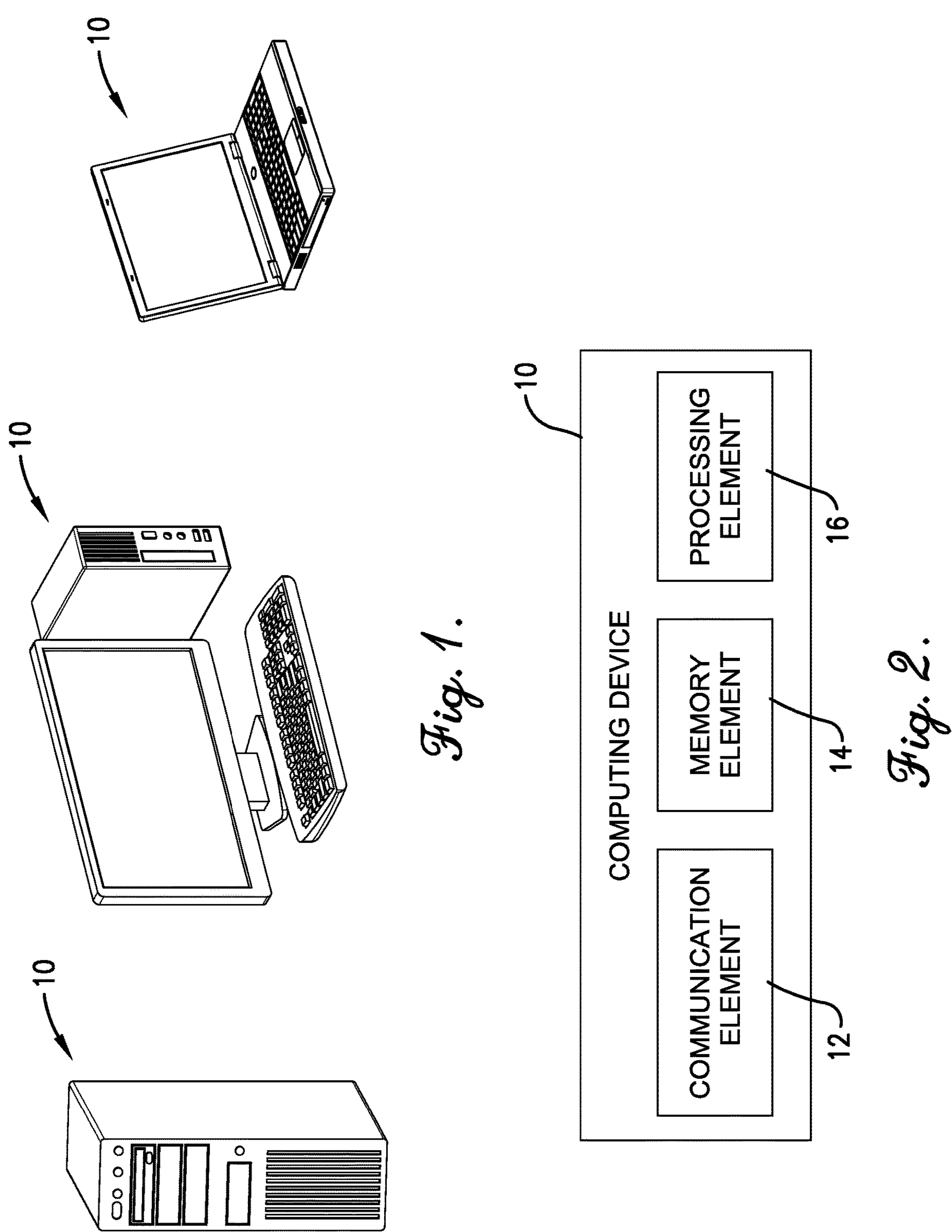
FIG. 1 is a diagram of a plurality of computing devices, each constructed in accordance with various embodiments of the invention and configured or programmed to generate a reduced equivalent model of an electric power network.
FIG. 2 is a block schematic diagram of various electronic components of the computing device.

The drawing figures do not limit the current invention to the specific embodiments disclosed and described herein. The drawings are not necessarily to scale, emphasis instead being placed upon clearly illustrating the principles of the invention.

DETAILED DESCRIPTION OF THE EMBODIMENTS

The following detailed description of the technology references the accompanying drawings that illustrate specific embodiments in which the technology can be practiced. The embodiments are intended to describe aspects of the technology in sufficient detail to enable those skilled in the art to practice the technology. Other embodiments can be utilized and changes can be made without departing from the scope of the current invention. The following detailed description is, therefore, not to be taken in a limiting sense. The scope of the current invention is defined only by the appended claims, along with the full scope of equivalents to which such claims are entitled.

Referring to FIGS. 1 and 2, a computing device 10, configured to implement various embodiments of the current invention is shown. The computing device 10 is configured to generate a model of an electric power network, wherein the model is reduced in size compared to a full scale electric power network model, but equivalent in function. The computing device 10 may be embodied by computer servers, workstation or desktop computers, laptop computers, and the like, as shown in FIG. 1. An embodiment of the computing device 10 may broadly comprise a communication element 12, a memory element 14, and a processing element 16, as shown in FIG. 2. The computing device 10 may include other components such as a monitor, a keyboard, a mouse, and the like, which will not be discussed in detail.

The communication element 12 generally allows the computing device 10 to communicate with other computing devices, external systems, servers, networks, and the like. The communication element 12 may include signal and/or data transmitting and receiving circuits, such as antennas, amplifiers, filters, mixers, oscillators, digital signal processors (DSPs), and the like. The communication element 12 may establish communication wirelessly by utilizing radio frequency (RF) signals and/or data that comply with communication standards such as cellular 2G, 3G, 4G, Voice over Internet Protocol (VoIP), LTE, Voice over LTE (VoLTE), or 5G, Institute of Electrical and Electronics Engineers (IEEE) 802.11 standard such as WiFi, IEEE 802.16 standard such as WiMAX, Bluetooth™, or combinations thereof. In addition, the communication element 12 may utilize communication standards such as ANT, ANT+, Bluetooth™ low energy (BLE), the industrial, scientific, and medical (ISM) band at 2.4 gigahertz (GHz), or the like. Alternatively, or in addition, the communication element 12 may establish communication through connectors or couplers that receive metal conductor wires or cables which are compatible with networking technologies such as ethernet. In certain embodiments, the communication element 12 may also couple with optical fiber cables. The communication element 12 may be in electronic communication with the memory element 14 and the processing element 16.

The memory element 14 may be embodied by devices or components that store data in general, and digital or binary data in particular, and may include exemplary electronic hardware data storage devices or components such as read-only memory (ROM), programmable ROM, erasable programmable ROM, random-access memory (RAM) such as static RAM (SRAM) or dynamic RAM (DRAM), cache memory, hard disks, floppy disks, optical disks, flash memory, thumb drives, universal serial bus (USB) drives, solid state memory, or the like, or combinations thereof. In some embodiments, the memory element 14 may be embedded in, or packaged in the same package as, the processing element 16. The memory element 14 may include, or may constitute, a non-transitory "computer-readable medium". The memory element 14 may store the instructions, code, code statements, code segments, software, firmware, programs, applications, apps, services, daemons, or the like that are executed by the processing element 16. The memory element 14 may also store data that is received by the processing element 16 or the device in which the processing element 16 is implemented. The processing element 16 may further store data or intermediate results generated during processing, calculations, and/or computations as well as data or final results after processing, calculations, and/or computations. In addition, the memory element 14 may store settings, text data, documents from word processing software, spreadsheet software and other software applications, sampled audio sound files, photograph or other image data, movie data, databases, and the like.

The processing element 16 may comprise one or more processors. The processing element 16 may include electronic hardware components such as microprocessors (single-core or multi-core), microcontrollers, digital signal processors (DSPs), field-programmable gate arrays (FPGAs), analog and/or digital application-specific integrated circuits (ASICs), or the like, or combinations thereof. The processing element 16 may generally execute, process, or run instructions, code, code segments, code statements, software, firmware, programs, applications, apps, processes, services, daemons, or the like. The processing element 16 may also include hardware components such as registers, finite-state machines, sequential and combinational logic, configurable logic blocks, and other electronic circuits that can perform the functions necessary for the operation of the current invention. In certain embodiments, the processing element 16 may include multiple computational components and functional blocks that are packaged separately but function as a single unit. In some embodiments, the processing element 16 may further include multiprocessor architectures, parallel processor architectures, processor clusters, and the like, which provide high performance computing. The processing element 16 may be in electronic communication with the other electronic components of the computing device 10 through serial or parallel links that include universal busses, address busses, data busses, control lines, and the like.

The processing element 16 may be operable, configured, and/or programmed to perform the following functions, processes, or methods by utilizing hardware, software, firmware, or combinations thereof. Other components, such as the communication element 12 and the memory element 14 may be utilized as well.

The processing element 16 receives, through the communication element 12, a description of an electric power network, also referred to as "the full scale system" or "the original system". The electric power network may include electric power generation, transmission, and distribution components to deliver electricity to customers for a particular region or area. The electric power network may be considered a power grid, or a portion thereof. The electric power network may include electric power generators, such as steam turbines, wind turbines, solar cell arrays, and the like, electric power stations or substations, transmission lines, transformers, and so forth. The electric power network may include a number of components ranging from thousands to tens of thousands. The description may describe and/or list all of the components of the electric power network and may include a listing of operating parameters of the components and measured data of various electrical characteristics of the components.

Figure 3:
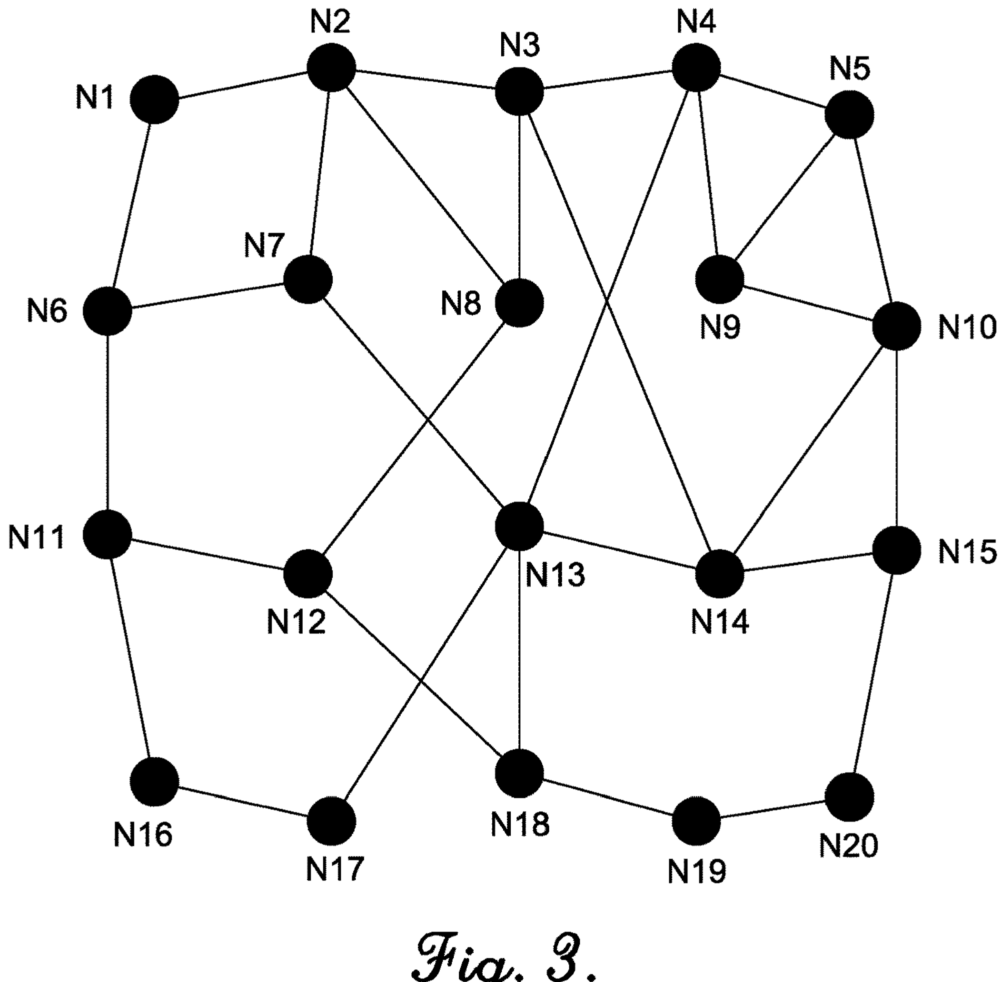
FIG. 3 is an exemplary plot topology of a full scale electric power network.

Referring to FIG. 3, a full scale topology of the electric power network may be represented graphically by a plot that includes a plurality of interconnected nodes and a plurality of edges in which each successive pair of nodes is connected by a successive one of the edges. In the exemplary full scale electric power network topology, there are twenty nodes, N1-N20, with each node connecting to at least one other node through a successive one of the edges. It will be appreciated, however, that FIG. 3 is an illustrative example of a full scale electric power network. An actual full scale topology will be much larger than can be feasibly illustrated herein and would typically have thousands to tens of thousands of nodes.

The nodes may represent electric power stations or substations, and the edges may represent transmission lines and transformers. A full scale model of the electric power network includes data, included in, or derived from, the received description, about each component in the topology such as electrical characteristics, operating parameters, and performance history of the electric power network, including electric current flow through various components of the network at various times of the day. The full scale model may include a netlist of the components mentioned above, with each component listed along with a listing of the other components to which the current component is connected. The netlist may be stored in the memory element 14.

The processing element 16 selects a plurality of initial network branches of focus. The branches of focus may include components, equipment, or areas of the electric power network of interest or concern for the system or grid operator or others who manage portions of the electric power network. The processing element 16 may select transmission facilities such as critical transmission lines, transformers, network contingencies, areas of network outage, components that often become overloaded, components that often operate close to, or at, their design limits, and the like. Network contingencies are presumed outages or failures of transmission facilities. By the NERC (North American Electric Reliability Corporation) reliability standard, the generation dispatch obtained from SCED/SCUC need to be N-1 secure (where N means the number of transmission facilities and 1 means a single facility outage or failure). N-1 secure means the generation dispatch will not cause any network equipment to overload in both system intact condition and the condition that any one of the transmission element is in outage or failure. The components, equipment, or areas of the electric power network of interest or concern are selected based on available operational data or simulation data from the electric power network. Information about electrical characteristics, such as resistance, reactance, and impedance, of components, equipment, or areas of the electric power network are not included in the branches of focus. Confidential information about the electric power network is not included in the branches of focus.

The processing element 16 determines a plurality of operating conditions of interest of the electric power network. The network operating conditions may include electric power generation data, load and electricity flow data in the electric power network, and power consumption in various geographic locations, among others. The processing element 16 may obtain data from the description of the electric power network including available historical operational data or data resulting from simulation of the full scale electric power network model. The processing element 16 may analyze the data to determine which data meets the conditions of interest criteria. The processing element 16 may augment the data by randomly generated operating conditions that are not covered in the available data to represent various possible conditions at which the electric power network may be operating. In the randomly generated operating conditions, electric power generation data is generated randomly within reasonable boundaries or may be determined by running SCED and/or SCUC applications on the full scale electric power network model. The electricity flow data through the electric power network during normal, intact operations and contingency conditions is collected, and may be utilized in subsequent operations. The processing element 16 may apply scenario reduction methods, such as Principal Component Analysis, as needed, to reduce the number of operating conditions, which also reduces the amount of data utilized in subsequent operations.

The processing element 16 updates the electric power network branches of focus to include data regarding critical operating conditions of interest, such as transmission facilities, derived from the electric power network operating conditions of interest data generated previously.

The processing element 16 clusters, groups, and/or merges a plurality of nodes of the electric power network. The nodes may also be considered to be busses and may represent electric power stations or substations. The nodes may be clustered, grouped, or merged to form super nodes with consideration, influence, and/or weighting of the network branches of focus. For example, the nodes or components included in the network branches of focus with similar characteristics may be more likely to be clustered or grouped together. The processing element 16 may implement artificial intelligence (AI) algorithms, such as k-means clustering, fuzzy k-means clustering, and the like, which separate data with similar characteristics into one of a plurality of groups may be utilized. For example, the processing element may use a clustering algorithm to determine that full scale electric power network topology nodes N1, N2, N6, and N7, shown in FIG. 3, should be clustered together to form one super node. The algorithms may utilize a power transfer distribution factor (PTDF) about each node as a criteria for clustering. The PTDF indicates an incremental change in real power that occurs on transmission lines due to real power transfers between two regions. These regions can be defined by geographic areas or nodes. The clustering may also include clustering those nodes together which have a similar impact on transmission facilities.

Figure 4:
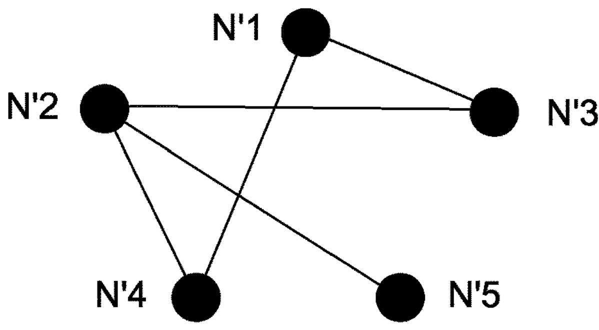
FIG. 4 is a plot of a topology of an equivalent reduced electric power network.

The processing element 16 generates an equivalent reduced electric power network topology, as shown in FIG. 4. The reduced electric power network topology, also referred to as "the reduced system", represents a reduced, compressed, minimized, or small-scale version of the structure or architecture of the full scale electric power network model. The reduced electric power network topology includes the updated network branches of focus and the clustered super nodes, and is derived from the connectivity of the electric power network. In the exemplary reduced electric power network topology, there are five super nodes, N'1-N'5, with various connections therebetween. As discussed above, the super nodes are formed using algorithms that group the full scale electric power network topology nodes together. For example, the full scale nodes N1, N2, N6, and N7, shown in FIG. 3, may be clustered to form super node N'1. The remaining super nodes may be formed in a similar manner.

For each item in the list of network branches of focus, the processing element 16 associates the two end points of each network branch with two different super nodes. The processing element 16 adds a connection between the super nodes. Between each pair of super nodes, if there is an electrical connection in the electric power network, the processing element 16 adds a new connection in the reduced electric power network topology between the two super nodes. If a contingency or outage is associated with two super nodes, the processing element 16 adds an additional connection between the two super nodes.

The processing element 16 generates a plurality of electrical parameters of the reduced electric power network topology. The electrical parameters vary according to, depend on, or are influenced by, the reduced electric power network topology and the operating condition data of interest. The electrical parameters may include electrical characteristics, such as resistances, reactances, and/or impedances, of each component, connection, or branch of the reduced electric power network topology. The processing element 16 determines the electrical parameters such that the electric current flow through the reduced electric power network topology is very close to, or within a tolerance level of, the electric current flow through the full scale electric power network model for the same electric power generation and load conditions.

When generating the electrical parameters of the reduced electric power network topology, the processing element 16 may perform a plurality of mathematical operations, such as solving a plurality of mathematical equations, in sequential fashion, concurrent fashion, or a combination of both. In addition, the processing element 16 may determine, create, and/or generate a plurality of matrices and mathematical data structures that serve as the input to, or result from the output of, the mathematical equations, as described herein.

It is assumed that the original system has $N_b$ buses, $N_1$ lines, and $N_9$ generators. Similarly, $N_z$ and $$N_l^{red}$$

are the reduced system's number of super nodes (or zones), and number of lines. Incident matrix $T_{zb}$ with a dimension of $N_z \times N_b$, defines the mapping from buses of the original system to super nodes of the reduced system. This matrix is used to convert the original system load at an operating condition s ($P_{D,s}$) to the reduced system load $$\left(P_{D,s}^{redu}\right)$$

as shown in EQ. 1:

$$P_{D,s}^{redu} = T_{zb} \times P_{D,s} \qquad \text{EQ. 1}$$

To show which generators are located at a specific super node, incident matrix $T_{zg}$ with the dimension of $N_z \times N_g$ is defined, which is used to convert the original system generation at an operating condition s ($P_{G,s}$) into the reduced system generation at this condition $$\left(P_{G,s}^{redu}\right)$$

as shown in EQ. 2:

$$P_{G,s}^{redu} = T_{zg} \times P_{G,s} \qquad \text{EQ. 2}$$

Therefore, an injection power at the operating condition s can be obtained by subtracting $$P_{G,s}^{redu}$$

and $$P_{D,s}^{redu}$$

as shown in EQ. 3:

$$P_{inj,s}^{base} = P_{G,s}^{redu} - P_{D,s}^{redu} \qquad \text{EQ. 3}$$

To convert the original system power flow in system-intact condition $$\left(F_s^{base\_orig}\right)$$

to the desired reduced system power flow $$\left(F_{desr,s}^{base}\right),$$

an incident matrix ($T_f$) with the dimension of $$N_l^{red}$$

$\times N_l$ is defined. Therefore, as shown in EQ. 4:

$$F_{desr,s}^{base} = T_f \times F_s^{base\_orig} \quad \text{EQ. 4}$$

The following equation is used to convert the original system power flow under branch contingency w $$\left(F_{s,w}^{cont\_orig}\right)$$

to the desired reduced system power flow in the same contingency condition $$\left(F_{s,w,desr}^{redu,cont}\right),$$

as shown in EQ. 5:

$$F_{desr,s,w}^{cont} = T_f \times F_{s,w}^{cont\_orig} \quad \text{EQ. 5}$$

The power flow of the reduced system can be calculated by the following equation, as shown in EQ. 6:

$$F_{est,s}^{base} = \text{diag}(B) \times C_{ft} \times \left(C_{ft}^T \times \text{diag}(B) \times C_{ft}\right)^{-1} \times P_{inj,s}^{base} \quad \text{EQ. 6}$$

In EQ. 6, B is the line susceptance vector, which is the inverse of reduced system line reactance vector X:

$$B = \frac{1}{X} \quad \text{EQ. 7}$$

In EQ. 6, incident matrix $C_{ft}$ shows which buses are connected to the specific line. Note that, for each line contingency condition, this incident matrix changes. Therefore, the reduced system power flow with respect to branch contingency w will be obtained by the corresponding incident matrix ($C_{ft,w}$), as shown in EQ. 8:

$$F_{est,s,w}^{cont} = \text{diag}(B) \times C_{ft,w} \times C_{ft,w}^T \times \text{diag}(B) \times C_{ft,w})^{-1} \times P_{inj,s,w}^{cont} \quad \text{EQ. 8}$$

The objective of the system reduction optimization model is to find line reactances of the reduced system so that its inter-super node power flows are very close to the inter-node power flows of the original system under both system intact and contingencies conditions. Therefore, the objective function of the model is written as the minimization of the below Euclidian norm as follows in EQs. 9A and 9B:

$$\underset{X}{\text{Min}} \sum_s \alpha_{s,0} \left\| F_{desr,s}^{base} - F_{est,s}^{base} \right\| + \sum_w \sum_s \alpha_{s,w} \left\| F_{desr,s,w}^{cont} - F_{est,s,w}^{cont} \right\| \quad \text{EQ. 9A}$$

$\alpha_{s,0}$ and $\alpha_{s,w}$ are customizable weighting factors. The optimization model can also be conveniently and selectively modified so that a specified accuracy level is achieved. For example, adjusting the clustering criteria in [0029] to increase the number of super nodes may increase the accuracy level.

The processing element 16 outputs an electric power network model that is reduced in scale and size compared to the full scale electric power network model, but is equivalent in function. The reduced electric power network model includes the reduced electric power network topology and the associated electrical parameters. The reduced electric power network model can be used as a model that simulates the electric power network when executing SCED and/or SCUC programs.

Figure 5:
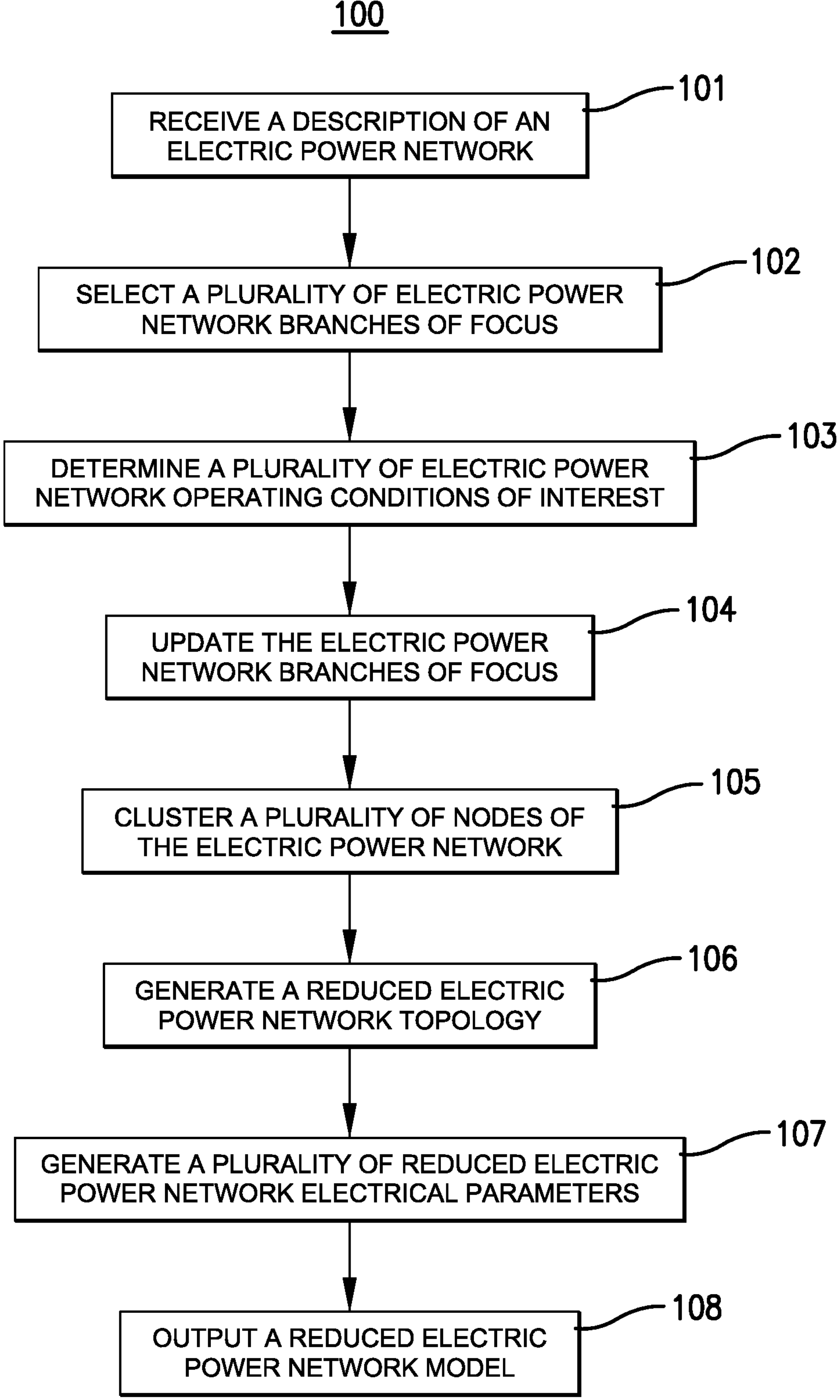
FIG. 5 is a listing of at least a portion of the steps of a method for generating a reduced equivalent model of an electric power network.

FIG. 5 depicts a listing of at least a portion of the steps of an exemplary computer-implemented method 100 for generating a model of an electric power network, wherein the model is reduced in size compared to a full scale electric power network model, but equivalent in function. The steps may be performed in the order shown in FIG. 5, or they may be performed in a different order. Furthermore, some steps may be performed concurrently as opposed to sequentially. In addition, some steps may be optional or may not be performed. The steps may be performed by the processing element 16 of the computing device 10 via hardware, software, firmware, or combinations thereof. Furthermore, the steps may be implemented as instructions, code, code segments, code statements, a program, an application, an app, a process, a service, a daemon, or the like, and may be stored on a computer-readable storage medium, such as the memory element 14.

Referring to step 101, a description of an electric power network is received. The electric power network may include electric power generation, transmission, and distribution components to deliver electricity to customers for a particular region or area. The electric power network may be considered a power grid, or a portion thereof. The electric power network may include electric power generators, such as steam turbines, wind turbines, solar cell arrays, and the like, electric power stations or substations, transmission lines, transformers, and so forth. The electric power network may include a number of components ranging from thousands to tens of thousands. The description may describe and/or list all of the components of the electric power network and may include a listing of operating parameters of the components and measured data of various electrical characteristics of the components.

Referring to FIG. 3, a full scale topology of the electric power network may be represented graphically by a plot that includes a plurality of interconnected nodes and a plurality of edges in which each successive pair of nodes is connected by a successive one of the edges. In the exemplary full scale electric power network, there are twenty nodes, N1-N20, with each node connecting to at least one other node through a successive one of the edges. The nodes may represent electric power stations or substations, and the edges may represent transmission lines and transformers. A full scale model of the electric power network includes data, included in, or derived from, the received description, about each component in the topology such as electrical characteristics, operating parameters, and performance history of the electric power network, including electric current flow through various components of the network at various times of the day. The full scale model may include a netlist of the components mentioned above, with each component listed along with a listing of the other components to which the current component is connected.

Referring to step 102, a plurality of electric power network branches of focus are selected. The branches of focus may include components, equipment, or areas of the electric power network of interest or concern for the system or grid operator or others who manage portions of the electric power network. For example, transmission facilities such as critical transmission lines, transformers, network contingencies, areas of network outage, components that often become overloaded, components that often operate close to, or at, their design limits, and the like may be included as network branches of focus. Network contingencies are presumed outages or failures of transmission facilities. By the NERC (North American Electric Reliability Corporation) reliability standard, the generation dispatch obtained from SCED/SCUC need to be N-1 secure (where N means the number of transmission facilities and 1 means a single facility outage or failure). N-1 secure means the generation dispatch will not cause any network equipment to overload in both system intact condition and the condition that any one of the transmission element is in outage or failure. The components, equipment, or areas of the electric power network of interest or concern are selected based on available operational data or simulation data from the electric power network. Information about electrical characteristics, such as resistance, reactance, and impedance, of components, equipment, or areas of the electric power network are not included in the branches of focus. Confidential information about the electric power network is not included in the branches of focus.

Referring to step 103, a plurality of electric power network operating conditions of interest are determined. The network operating conditions may include electric power generation data, load and electricity flow data in the electric power network, and power consumption in various geographic locations, among others. The operating conditions data is obtained from the description of the electric power network including available historical operational data or data resulting from simulation of the full scale electric power network model. The data may be analyzed to determine which data meets the conditions of interest criteria. The operating conditions data is augmented by randomly generated operating conditions that are not covered in the available data to represent various possible conditions at which the electric power network may be operating. In the randomly generated operating conditions, electric power generation data is generated randomly within reasonable boundaries or may be determined by running SCED and/or SCUC applications on the full scale electric power network model. The electricity flow data through the electric power network during normal, intact operations and contingency conditions is collected, and may be utilized in subsequent steps. In the current step, scenario reduction methods, such as Principal Component Analysis, may be applied, as needed, to reduce the number of operating conditions, which also reduces the amount of data utilized in subsequent steps.

Referring to step 104, the electric power network branches of focus are updated to include data regarding critical operating conditions of interest, such as transmission facilities, derived from the electric power network operating conditions of interest data determined in step 103.

Referring to step 105, a plurality of nodes of the electric power network are clustered, grouped, or merged. The nodes may also be considered to be busses and may represent electric power stations or substations. The nodes may be clustered, grouped, or merged to form super nodes with consideration, influence, and/or weighting of the network branches of focus. For example, the nodes or components included in the network branches of focus with similar characteristics may be more likely to be clustered or grouped together. Artificial intelligence algorithms, such as k-means clustering, fuzzy k-means clustering, and the like, which separate data with similar characteristics into one of a plurality of groups may be utilized. For example, a clustering algorithm may be used to cluster full scale electric power network topology nodes N1, N2, N6, and N7, shown in FIG. 3, together to form one super node. The algorithms may utilize a power transfer distribution factor (PTDF) about each node as a criteria for clustering. The PTDF indicates an incremental change in real power that occurs on transmission lines due to real power transfers between two regions. These regions can be defined by geographic areas or nodes. The clustering may also include clustering those nodes together which have a similar impact on transmission facilities.

Referring to step 106 and FIG. 4, an equivalent reduced electric power network topology is generated. The reduced electric power network topology represents a reduced, compressed, minimized, or small-scale version of the structure or architecture of the full scale electric power network model. The reduced electric power network topology includes the updated network branches of focus from step 104, the clustered super nodes from step 105, and is derived from the connectivity of the electric power network. In the exemplary reduced electric power network topology, there are five super nodes, N1-N'5, with various connections therebetween. As discussed in step 105, the super nodes are formed using algorithms that group the full scale electric power network topology nodes together. For example, the full scale nodes N1, N2, N6, and N7, shown in FIG. 3, may be clustered to form super node N'1. The remaining super nodes may be formed in a similar manner.

For each item in the list of network branches of focus, the two end points of each network branch are associated with two different super nodes, and a connection is added between the super nodes. Between each pair of super nodes, if there is an electrical connection in the electric power network, a new connection will be added in the reduced electric power network topology between the two super nodes. If a contingency or outage is associated with two super nodes, an additional connection will be added between the two super nodes.

Referring to step 107, a plurality of electrical parameters of the reduced electric power network topology are generated. The electrical parameters vary according to, depend on, or are influenced by, the reduced electric power network topology from step 106 and the operating condition data of interest from step 103. The electrical parameters may include electrical characteristics, such as resistances, reactances, and/or impedances, of each component, connection, or branch of the reduced electric power network topology. The electrical parameters are determined such that the electric current flow through the reduced electric power network topology is very close to, or within a tolerance level of, the electric current flow through the full scale electric power network model for the same electric power generation and load conditions.

To determine the electrical parameters of the reduced electric power network topology, the mathematical operations using equations EQ. 1 through EQ. 9A, described above, are executed.

Referring to step 108, the reduced equivalent electric power network model is output. The reduced equivalent electric power network model includes the reduced electric power network topology determined in step 106 and the electrical parameters determined in step 107. The reduced equivalent electric power network model can be used as a model that simulates the full scale electric power network model when executing SCED and/or SCUC programs.

Figure 6:
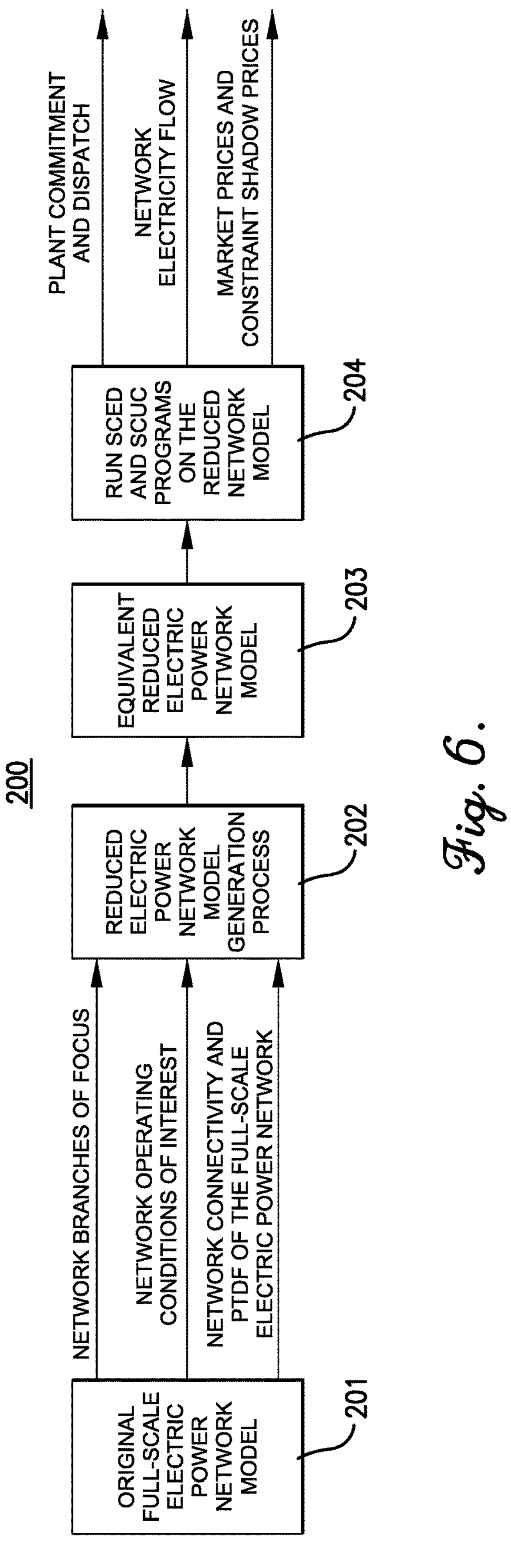
FIG. 6 is a flow diagram of a process of creating and using the reduced equivalent electric power network model with security constrained economic dispatch and security constrained unit commitment programs.

Referring to FIG. 6, a flow diagram 200 illustrating at least one method or process of generating performance data for an electric power network by creating and using the reduced electric power network model is shown. At block 201, the full scale electric power network model serves an input to the process. The full scale electric power network model includes the information describing the structure and electrical parameters, or characteristics, of the electric power network. The following information is derived from the full scale original electric power network model: the network branches of focus, the network operating conditions of interest, and the network connectivity and PTDF of the electric power network. Each of these features is described above.

At block 202, the method 100 is performed. At block 203, the equivalent reduced electric power network model is output. At block 204, SCED and/or SCUC programs are executed on the reduced electric power network model. The following quantities are output as a result of executing the SCED and/or SCUC programs: a plant commitment and dispatch, a network electric current flow, and market prices and constraint shadow prices, among others.

The embodiments of the current invention use a full scale electric power network model, with actual power line electricity flow data and power network congestion data from a large power grid, as an input to generate an equivalent reduced electric power network model. When power system SCED/SCUC problems are applied to the reduced electric power network model, the model will produce highly accurate results (such as power line electricity flow, network congestion, market clearing prices, generation dispatch) as compared to the results when the SCED/SCUC problems are applied to the full scale electric power network model.

After following the process of the flow diagram 200, it has been shown that the quantities output from the SCED and/or SCUC programs, particularly the network electric current flow, when using the reduced electric power network model are very close to, or within a tolerance level of, the quantities that are output when the full scale electric power network model is used. Furthermore, usage of the reduced electric power network model in SCED and/or SCUC programs reduces the computation time from the time frame of days or weeks using the full scale model to the time frame of minutes to hours. At the same time, the reduced electric power network model hides the detailed information of the electric power network (such as the topology and parameters of the full scale network system), and replaces it with a fictitious network with fictitious network parameters, making the reduced electric power network model sharable to the public. In addition, it is not feasible to reverse engineer the original network from the published reduced electric power network.

Additional Considerations

Throughout this specification, references to "one embodiment", "an embodiment", or "embodiments" mean that the feature or features being referred to are included in at least one embodiment of the technology. Separate references to "one embodiment", "an embodiment", or "embodiments" in this description do not necessarily refer to the same embodiment and are also not mutually exclusive unless so stated and/or except as will be readily apparent to those skilled in the art from the description. For example, a feature, structure, act, etc. described in one embodiment may also be included in other embodiments but is not necessarily included. Thus, the current invention can include a variety of combinations and/or integrations of the embodiments described herein.

Although the present application sets forth a detailed description of numerous different embodiments, it should be understood that the legal scope of the description is defined by the words of the claims set forth at the end of this patent and equivalents. The detailed description is to be construed as exemplary only and does not describe every possible embodiment since describing every possible embodiment would be impractical. Numerous alternative embodiments may be implemented, using either current technology or technology developed after the filing date of this patent, which would still fall within the scope of the claims.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Certain embodiments are described herein as including logic or a number of routines, subroutines, applications, or instructions. These may constitute either software (e.g., code embodied on a machine-readable medium or in a transmission signal) or hardware. In hardware, the routines, etc., are tangible units capable of performing certain operations and may be configured or arranged in a certain manner. In example embodiments, one or more computer systems (e.g., a standalone, client or server computer system) or one or more hardware modules of a computer system (e.g., a processor or a group of processors) may be configured by software (e.g., an application or application portion) as computer hardware that operates to perform certain operations as described herein.

In various embodiments, computer hardware, such as a processing element, may be implemented as special purpose or as general purpose. For example, the processing element may comprise dedicated circuitry or logic that is permanently configured, such as an application-specific integrated circuit (ASIC), or indefinitely configured, such as an FPGA, to perform certain operations. The processing element may also comprise programmable logic or circuitry (e.g., as encompassed within a general-purpose processor or other programmable processor) that is temporarily configured by software to perform certain operations. It will be appreciated that the decision to implement the processing element as special purpose, in dedicated and permanently configured circuitry, or as general purpose (e.g., configured by software) may be driven by cost and time considerations.

Accordingly, the term "processing element" or equivalents should be understood to encompass a tangible entity, be that an entity that is physically constructed, permanently configured (e.g., hardwired), or temporarily configured (e.g., programmed) to operate in a certain manner or to perform certain operations described herein. Considering embodiments in which the processing element is temporarily configured (e.g., programmed), each of the processing elements need not be configured or instantiated at any one instance in time. For example, where the processing element comprises a general-purpose processor configured using software, the general-purpose processor may be configured as respective different processing elements at different times. Software may accordingly configure the processing element to constitute a particular hardware configuration at one instance of time and to constitute a different hardware configuration at a different instance of time.

Computer hardware components, such as communication elements, memory elements, processing elements, and the like, may provide information to, and receive information from, other computer hardware components. Accordingly, the described computer hardware components may be regarded as being communicatively coupled. Where multiple of such computer hardware components exist contemporaneously, communications may be achieved through signal transmission (e.g., over appropriate circuits and buses) that connect the computer hardware components. In embodiments in which multiple computer hardware components are configured or instantiated at different times, communications between such computer hardware components may be achieved, for example, through the storage and retrieval of information in memory structures to which the multiple computer hardware components have access. For example, one computer hardware component may perform an operation and store the output of that operation in a memory device to which it is communicatively coupled. A further computer hardware component may then, at a later time, access the memory device to retrieve and process the stored output. Computer hardware components may also initiate communications with input or output devices, and may operate on a resource (e.g., a collection of information).

The various operations of example methods described herein may be performed, at least partially, by one or more processing elements that are temporarily configured (e.g., by software) or permanently configured to perform the relevant operations. Whether temporarily or permanently configured, such processing elements may constitute processing element-implemented modules that operate to perform one or more operations or functions. The modules referred to herein may, in some example embodiments, comprise processing element-implemented modules.

Similarly, the methods or routines described herein may be at least partially processing element-implemented. For example, at least some of the operations of a method may be performed by one or more processing elements or processing element-implemented hardware modules. The performance of certain of the operations may be distributed among the one or more processing elements, not only residing within a single machine, but deployed across a number of machines. In some example embodiments, the processing elements may be located in a single location (e.g., within a home environment, an office environment or as a server farm), while in other embodiments the processing elements may be distributed across a number of locations.

Unless specifically stated otherwise, discussions herein using words such as "processing," "computing," "calculating," "determining," "presenting," "displaying," or the like may refer to actions or processes of a machine (e.g., a computer with a processing element and other computer hardware components) that manipulates or transforms data represented as physical (e.g., electronic, magnetic, or optical) quantities within one or more memories (e.g., volatile memory, non-volatile memory, or a combination thereof), registers, or other machine components that receive, store, transmit, or display information.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus.

The patent claims at the end of this patent application are not intended to be construed under 35 U.S.C. § 112(f) unless traditional means-plus-function language is expressly recited, such as "means for" or "step for" language being explicitly recited in the claim(s).

Although the technology has been described with reference to the embodiments illustrated in the attached drawing figures, it is noted that equivalents may be employed and substitutions made herein without departing from the scope of the technology as recited in the claims.

Having thus described various embodiments of the technology, what is claimed as new and desired to be protected by Letters Patent includes the following:

The invention claimed is:

1. A method for generating and using a model of an electric power network, the method comprising:

receiving a description of an electric power network, the electric power network including a plurality of interconnected nodes;

selecting a plurality of electric power network branches of focus from the description of the electric power network;

generating a plurality of electric power network operating conditions of interest;

updating the electric power network branches of focus to include data regarding critical operating conditions of interest;

clustering nodes of the electric power network to form a plurality of super nodes;

associating a first end point and a second end point of each network branch of focus with a first super node and a second super node, respectively;

adding a connection between the first super node and the second super node for the network branch of focus;

generating a reduced electric power network topology that includes the super nodes;

generating a plurality of reduced electric power network electrical parameters; and outputting an electric power network model that includes the reduced electric power network topology and the reduced electric power network electrical parameters; and executing at least one of security constrained economic dispatch and security constrained unit commitment computer software programs using the electric power network model that includes the reduced electric power network topology and the reduced electric power network electrical parameters.

2. The method of claim 1, wherein the description of the electric power network further includes a listing of a plurality of electric power generation, transmission, and distribution components.

3. The method of claim 1, wherein the electric power network branches of focus include transmission lines, transformers, network contingencies, areas of network outage, components that have historically become overloaded, and components that have historically operated close to, or at, their design limits.

4. The method of claim 1, wherein the electric power network operating conditions of interest include electric power generation data, load and electricity flow data in the electric power network, and power consumption in various geographic locations.

5. The method of claim 1, wherein generating electric power network operation conditions of interest includes randomly generating electric power generation data.

6. The method of claim 1, wherein generating electric power network operation conditions of interest includes obtaining and analyzing historical operational data.

7. The method of claim 1, wherein clustering nodes of the electric power network includes performing k-means clustering.

8. The method of claim 1, wherein the reduced electric power network electrical parameters vary according to the reduced electric power network topology and to the electric power network operating conditions of interest.

9. The method of claim 1, wherein generating the reduced electric power network electrical parameters includes solving a plurality of mathematical equations involving a plurality of matrices.

10. The method of claim 1, further comprising adding a connection between each pair of super nodes in the reduced electric power network topology if there is an electrical connection in the electric power network.

11. The method of claim 1, further comprising adding a connection between two super nodes if a contingency or outage is associated with the super nodes.

12. The method of claim 8, wherein the reduced electric power network electrical parameters vary according to electrical characteristics of each component, connection, or branch of the reduced electric power network topology.

13. The method of claim 9, wherein the matrices are defined in part by the mapping of buses of the electric power network to the super nodes of the reduced electric power network topology.

14. A method for generating performance data for an electric power network, the method comprising:

receiving a full scale electric power network model including information describing a structure, including a plurality of interconnected nodes, and electrical parameters of the electric power network;

generating a reduced electric power network model using data from the full scale electric power network model, the generation of the reduced electric power network model including:

selecting a plurality of electric power network branches of focus from the description of the electric power network, generating a plurality of electric power network operating conditions of interest, updating the electric power network branches of focus to include data regarding critical operating conditions of interest, clustering a plurality of nodes of the electric power network to form a plurality of super nodes, associating a first end point and a second end point of each network branch of focus with a first super node and a second super node, respectively, adding a connection between the first super node and the second super node for the network branch of focus, generating a reduced electric power network topology that includes the super nodes, generating a plurality of reduced electric power network electrical parameters, and outputting an electric power network model that includes the reduced electric power network topology and the reduced electric power network electrical parameters;

executing security constrained economic dispatch or security constrained unit commitment computer software programs using the reduced electric power network model that includes a reduced electric power network topology and reduced electric power network electrical parameters; and outputting data regarding a performance of the electric power network, the data generated from executing security constrained economic dispatch or security constrained unit commitment computer software programs using the reduced electric power network model, the data including at least one of plant commitment and dispatch, electric power network electricity flow, and market prices.

15. The method of claim 14, wherein the performance data further includes constraint shadow prices.

16. A computing device for generating and using a model of an electric power network, the computing device comprising:

a processing element in electronic communication with a memory element, the processing element programmed, configured, or a combination thereof, to:

receive a description of an electric power network, the electric power network including a plurality of interconnected nodes;

select a plurality of electric power network branches of focus from the description of the electric power network;

generate a plurality of electric power network operating conditions of interest;

update the electric power network branches of focus to include data regarding critical operating conditions of interest;

cluster a plurality of nodes of the electric power network to form a plurality of super nodes;

associate a first end point and a second end point of each network branch of focus with a first super node and a second super node, respectively;

add a connection between the first super node and the second super node for the network branch of focus;

generate a reduced electric power network topology that includes the super nodes;

generate a plurality of reduced electric power network electrical parameters;

output an electric power network model that includes the reduced electric power network topology and the reduced electric power network electrical parameters; and execute at least one of security constrained economic dispatch and security constrained unit commitment computer software programs using the electric power network model that includes the reduced electric power network topology and the reduced electric power network electrical parameters.

17. The computing device of claim 16, wherein the description of the electric power network further includes a listing of a plurality of electric power generation, transmission, and distribution components.

18. The computing device of claim 16, wherein the electric power network branches of focus include transmission lines, transformers, network contingencies, areas of network outage, components that have historically become overloaded, and components that have historically operated close to, or at, their design limits.

19. The computing device of claim 16, wherein the electric power network operating conditions of interest include electric power generation data, load and electricity flow data in the electric power network, and power consumption in various geographic locations.

20. The computing device of claim 16, wherein the processing element generating electric power network operation conditions of interest includes randomly generating electric power generation data and obtaining and analyzing historical operational data.

21. The computing device of claim 16, wherein the reduced electric power network electrical parameters vary according to electrical characteristics of each component, connection, or branch of the reduced electric power network topology and to the electric power network operating conditions of interest.

* * * * *